United States Patent [19]
Kitagawa

[11] Patent Number: 6,117,792
[45] Date of Patent: Sep. 12, 2000

[54] METHOD FOR MANUFACTURING SEMICONDUCTOR DEVICE

[75] Inventor: Makoto Kitagawa, Shiga, Japan

[73] Assignee: NEC Corporation, Tokyo, Japan

[21] Appl. No.: 09/320,971

[22] Filed: May 27, 1999

[30] Foreign Application Priority Data

May 27, 1998 [JP] Japan .................................. 10-145480

[51] Int. Cl.⁷ .................................................. H01L 21/00
[52] U.S. Cl. ......................... 438/737; 438/715; 438/719; 438/742
[58] Field of Search ..................... 438/715, 719, 438/720, 723, 724, 737, 738, 742, 743, 744, 637, 643, 647, 653, 657, 660, 672, 675, 688

[56] References Cited

U.S. PATENT DOCUMENTS 5,521,113  5/1996  Hsue et al. ........................... 438/720 X
5,945,350  8/1999  Violette et al. ...................... 438/738 X

*Primary Examiner*—William Powell

[57] ABSTRACT

A contact hole reaching a surface of a silicon substrate and a contact hole penetrating a resistor are formed on an interlayer insulation film by simultaneous etching. Then, a laminated film having a lower Ti layer and an upper TiN layer is formed as a substrate layer (barrier layer) of a wiring on the interlayer insulation film to bury the contact hole. Then, an annealing treatment is carried out at a temperature of 620° C. Consequently, the laminated film buried in the contact hole penetrating the resistor and the resistor are caused to electrically come in contact with each other on a side face of the wiring (side contact).

4 Claims, 2 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device wherein a polysilicon wiring functioning as a resistor is formed on an interlayer insulation film which is a lower layer such as an SRAM, an interlayer insulation film is formed on the polysilicon wiring, a metallic wiring such as aluminum is formed on the interlayer insulation film, and a contact hole to be connected with the metallic wiring is provided through a polysilicon wiring layer to get a side contact.

2. Description of the Related Art

By taking, as an example, the case of the SRAM having a high resistance as a load, a conventional method and structure for manufacturing a semiconductor device will be described with reference to FIGS. 1 and 2. FIG. 1 is a sectional view showing a main part during a process, and FIG. 2 is a sectional view showing the same portion of a step to be performed thereafter of an embodiment of the present invention. However, a semiconductor device to be manufactured and components thereof are the same as those in the prior art.

A field oxide film 2 for defining an element forming region is selectively formed on a surface of a semiconductor substrate 1 made of P-type single crystal silicon, and a gate oxide film 3 is formed in the element forming region.

Next, a WSi film having upper and lower faces interposed with polysilicon is formed over the whole surface, for example, and is then subjected to patterning. Consequently, a transfer transistor A, a driver transistor B, gate electrodes (gate wirings) 4a and 4b of other transistors which are not shown are formed to divide the element forming region into two portions, respectively. The gate electrode 4b of the driver transistor extends across the field oxide film 3, and has an end reaching the element forming region of the transfer transistor.

Then, P is introduced shallowly at a low concentration by ion implantation by using the gate electrodes 4a and 4b and the field oxide film 3 (and a photoresist film formed in necessary portions which are not shown) as masks so that an LDD portion 5 is formed. Then, an oxide film is formed over the whole surface by CVD. Consequently, etch-back is performed over the whole surface of the oxide film by anisotropic dry etching to expose the upper faces of the gate electrodes 4a and 4b. Consequently, a side wall 6 is formed on the ends of the upper faces of the gate electrodes 4a and 4b.

Thereafter, As is introduced comparatively deeply at a high concentration by ion implantation by using the side wall 6, the gate electrodes 4a and 4b and the field oxide film 3 (and the photoresist film formed in the necessary portions which are not shown) as masks. Consequently, a source-drain region 7 is formed.

Subsequently, a first oxide film 8 and a first BPSG 9 are formed, by CVD, as an interlayer insulation film which is a first layer. The first BPSG 9 is formed thickly and is subjected to heat treatment reflow. Consequently, the first BPSG 9 is made smooth. Then, the whole surface of the first BPSG 9 is subjected to etch-back to leave a predetermined thickness.

Next, a contact hole (not shown) reaching a predetermined active region of the semiconductor substrate 1 is formed by etching. Consequently, a WSi film 100 having a Si film 101 provided thereon is formed on a surface by sputtering. The WSi film 100 is subjected to patterning to form a wiring such as a Vcc line 10a, a Gnd line 10b and the like. In addition, an etching stopper layer 10c is formed in a position where a contact is to be provided for connection with the wiring provided on a resistor made of polysilicon which is to be formed in a subsequent step.

A second oxide film 11 is formed as a second interlayer insulation film on the whole surface by CVD. Then, a common contact hole 12 for exposing a part of a surface of a drain region 7 of the transfer transistor A including an end of the gate electrode 4B of the driver transistor B extending thereto is formed by dry etching. P ions are implanted into the common contact hole 12 at a high concentration. The reference numeral 13 denotes an implantation part.

Then, a polysilicon film is formed by CVD and P is introduced, using the photoresist film as a mask by ion implantation, into a load resistance portion which will be described below. Consequently, a predetermined layer resistor is obtained. Similarly, P is introduced at a higher concentration into a portion which is a resistor for generating a reference voltage which will be described below. Consequently, a predetermined layer resistor is obtained. Patterning is performed to form a load resistor 14a having one of ends connected to the drain region 7 of the transfer transistor A and the gate electrode 4B of the driver transistor B in the common contact hole 12 and a resistor 14b for generating a reference voltage. The resistor 14b for generating a reference voltage has both ends connected with the upper wiring. The above-mentioned etching stopper layer 10c is provided below the connection point.

Thereafter, a third oxide film 15 and a second BPSG film 16 are formed by CVD. These two layers are added to from an interlayer insulation film which is a third layer. The second BPSG film 16 is formed thickly and is subjected to heat treatment reflow to obtain a smooth surface. Subsequently, the whole surface is subjected to etch-back to leave a predetermined thickness.

Next, a contact hole 17b to be opened on the resistor 14b for generating a reference voltage is formed by etching simultaneously with the formation of a contact hole 17a toward the active region of the semiconductor substrate 1. Referring to this etching, a taper is first provided on the opening by wet etching and anisotropic dry etching is then performed. While it is preferable that a contact hole 17b for the resistor 14b should expose the surface of the resistor 14b to perform nothing beyond that, a great difference in an etching speed is not made while etching is being performed deeply toward the surface of the semiconductor substrate 1 so that the resistor 14 made of polysilicon is subjected to etching, the second oxide film provided under the resistor 14 is also subjected to the etching and the etching is stopped by an etching stopper 10c made of WSi having a great difference in the etching speed. More specifically, the time and labor required for separately performing the etching is omitted and simultaneous etching is performed in such a manner that a contact (side contact) can be obtained on an etched end face of the resistor 14b. By the above-mentioned steps, a shape shown in FIG. 1 can be obtained.

Next, a Ti/TiN film 18a is formed by sputtering as shown in FIG. 2.

Then, annealing is performed in the $N_2$ atmosphere to react Ti with Si. Consequently, a contact is obtained. As the annealing conditions, lamp annealing is performed at a temperature of 650° C. for 60 seconds.

Thereafter, an Al film (Al—Cu—Si) 18 and a TiN film 18b are sequentially formed by sputtering. These laminated films 18a, 18 and 18b are subjected to patterning to form a digit line connected to the transfer transistor A through the contact hole 17a, a wiring connected to the resistor 14b through the contact hole 17b, and the like.

Subsequently, a PSG film 20 and an SiN film 21 are formed as cover films. After a step of opening a pad portion (not shown) and other necessary steps, an SRAM is completed.

The above-mentioned conventional manufacturing method has used the simultaneously etching step for the simple process to form the contact hole 17a to be provided toward the surface of the semiconductor substrate 1 and the contact hole 17b to be provided toward the resistor 14b acting as an upper layer and made of polysilicon. In the present situation, however, a difference between an etching speed for an interlayer insulation film formed of an oxide film and an etching speed for the resistor 14b formed of a polysilicon film cannot be increased. Therefore, if the simultaneous etching is performed, the contact hole 17b is opened earlier toward the resistor 14b and the resistor 14b is then subjected to etching to penetrate the back until the contact hole 17a is opened toward the surface of the semiconductor substrate 1. Therefore, connection has to be performed by a side contact. However, a sufficient contact cannot be obtained in some conventional cases. For this reason, a reference voltage for deciding the resistor 14b is varied so that excellent characteristics cannot be obtained. The above-mentioned annealing conditions originally applies the exact conditions suitable for the surface contact of a barrier film made of Ti/TiN in the active region of the semiconductor substrate. Therefore, the conventional annealing conditions are not suitable for the side contact for the polysilicon film.

SUMMARY OF THE INVENTION

It is an object of the present invention to provide a manufacturing method for a semiconductor device wherein a stable contact can be obtained also in the case where the contact hole is formed to get a side contact through the wiring made of the polysilicon film.

In a method for manufacturing a semiconductor device comprising the steps of forming a lower interlayer insulation film on a semiconductor substrate, forming a wiring made of a polysilicon film on the lower interlayer insulation film, forming an upper interlayer insulation film for covering the wiring, simultaneously forming, by dry etching, a first contact hole reaching an active region on a surface of the semiconductor substrate through the upper and lower interlayer insulation films and a second contact hole penetrating the polysilicon film constituting the upper interlayer insulation film and the wiring, forming a Ti/TiN laminated film, and performing an annealing treatment to cause the Ti/TiN laminated film to be subjected to surface contact with the active region and to side contact with the polysilicon film. The annealing treatment is carried out at a low temperature of 610° C. to 630° C. It has found that a contact resistance for the side contact is raised and a variation is also increased if the annealing temperature is higher than 630° C. At a temperature lower than 610° C, the contact resistance tends to be raised if the temperature is lower in the contact portion with the semiconductor substrate and the side contact portion with the polysilicon film.

A manufacturing method of the present invention is applied to a semiconductor device in which a lower interlayer insulation film is formed on a semiconductor substrate, a wiring made of a polysilicon film is formed on the lower interlayer insulation film, an upper interlayer insulation film is formed for covering the wiring, a first contact hole reaching an active region on a surface of the semiconductor substrate through the upper and lower interlayer insulation films and a second contact hole penetrating the upper interlayer insulation film and the polysilicon film constituting the wiring are simultaneously formed by dry etching, and a Ti/TiN laminated film is formed as a barrier layer to get a contact. While an SRAM is taken as an example in an embodiment which will be described below, the present invention is not restricted thereto.

After the Ti/TiN laminated film is formed, an annealing treatment is carried out. The present invention is characterized by the annealing conditions. An annealing temperature of 610° C. to 630° C. is suitable. The $N_2$ atmosphere is used and a rapid heating treatment one by one is usually carried out by lamp heating. The raised temperature is kept for 60 to 100 seconds. If a plurality of wafers are to be subjected to a batch treatment at the same time, the holding time can be increased more.

Then, a film made of Al or Al alloy (for example, Al alloy including Cu or Si) is formed. The Ti/TiN film is subjected to patterning together with the Al or Al alloy film. Thus, an Al wiring is formed.

DESCRIPTION OF THE PREFERRED EMBODIMENT

An embodiment of the present invention will be described below with reference to the drawings. Since a semiconductor device to be manufactured and components thereof are the same as those in the prior art shown in FIGS. 1 and 2, the drawings will be shared.

Figure 1:
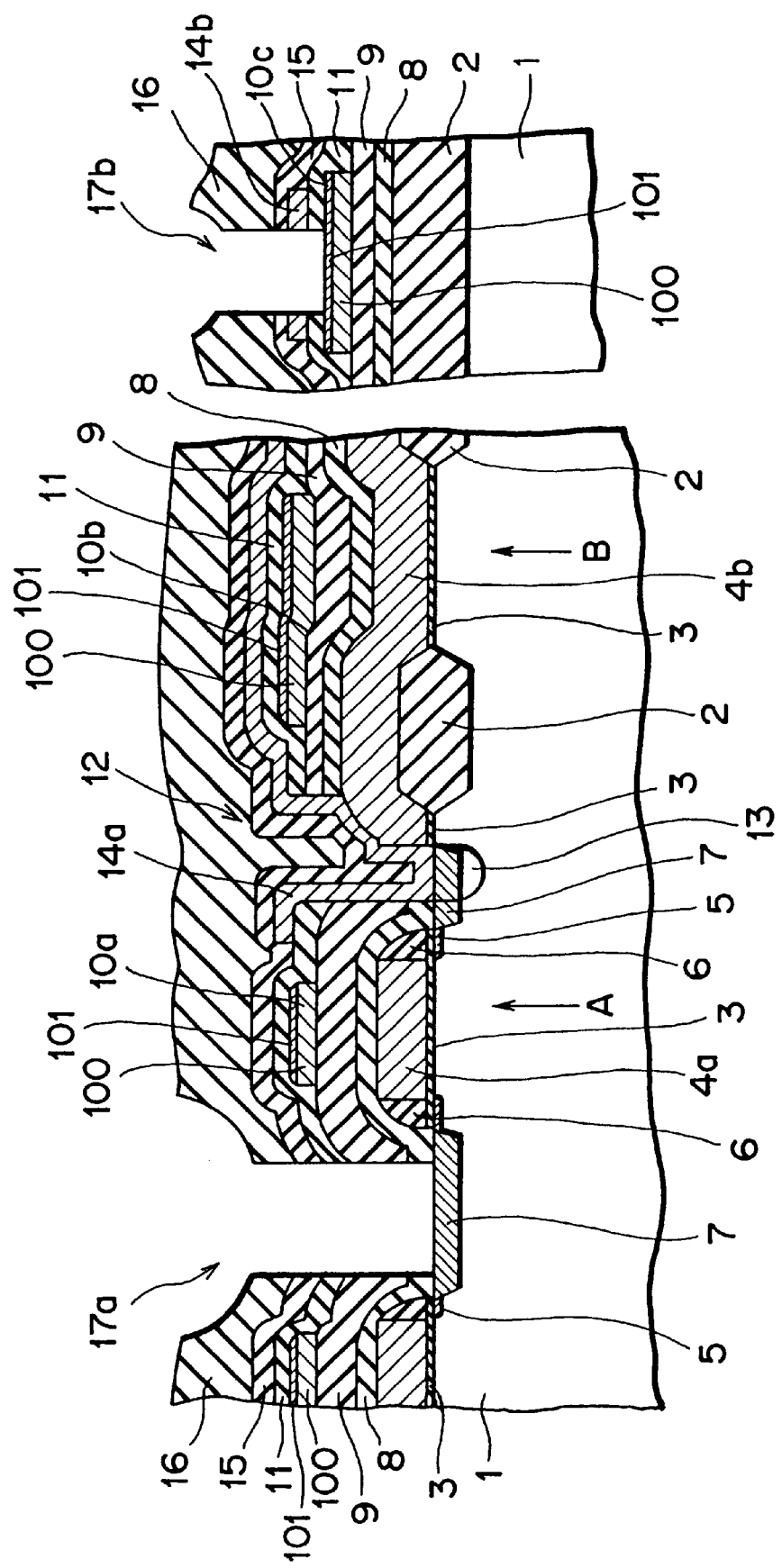
FIG. 1 is a sectional view showing a step according to an embodiment of the present invention and the prior art.

Since the same manufacturing method as in the prior art is used before a process for preparing an intermediate processed part shown in FIG. 1, its description will be omitted.

Figure 2:
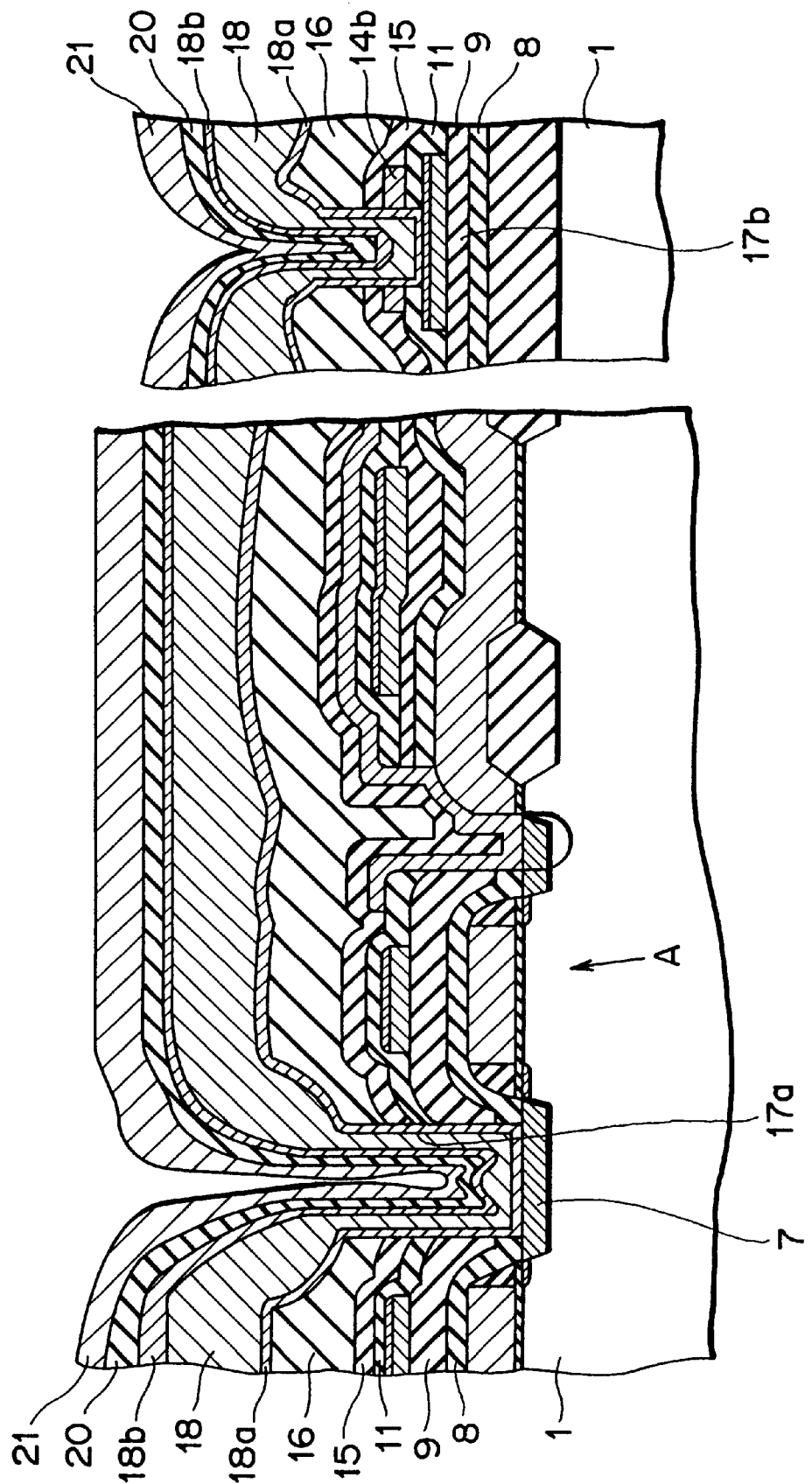
FIG. 2 is a sectional view showing a step subsequent to 1.

After a structure shown in FIG. 1 is obtained, a Ti/TiN laminated film 18a is formed by sputtering as shown in FIG. 2. Ti film has a thickness of 0.08 $\mu$m and TiN film has a thickness of 0.1 $\mu$m. Ti film is subjected to sputtering in the atmosphere including an $N_2$ gas to form the TiN film formed by the sputtering.

Then, annealing is performed in the $N_2$ atmosphere to react Ti with Si. Consequently, a contact is obtained. As the annealing conditions, lamp annealing is performed at a temperature of 620° C. for 60 seconds.

In the same manner as in the prior art, subsequently, an Al film (Al—Cu—Si) 18 and a TiN film 18b are sequentially formed by sputtering. The laminated films 18a, 18 and 18b are subjected to patterning to form a digit line connected to a transfer transistor A through a contact hole 17a, a wiring connected to a resistor 14b through a contact hole 17b, and the like. Then, residual necessary steps are performed. Thus, an SRAM is completed.

According to the present embodiment, the annealing temperature is low. Therefore, the Ti/TiN film 18a can be well subjected to side contact with the polysilicon film.

According to the manufacturing method of the present invention described above, when the interlayer insulation film is provided on the wiring made of the polysilicon film, and the contact hole is provided on the interlayer insulation film and the upper wiring having the Ti/TiN laminated film on the lower side is provided on the contact hole, a stable contact can be obtained also in the case where the contact hole is formed to get a side contact through the wiring made of the polysilicon film.

What is claimed is:

1. A method for manufacturing a semiconductor device comprising the steps of:

forming a lower interlayer insulation film on a semiconductor substrate;

forming a wiring made of a polysilicon film on the lower interlayer insulation film;

forming an upper interlayer insulation film for covering the wiring;

simultaneously forming, by dry etching, a first contact hole reaching an active region on a surface of the semiconductor substrate through the upper and lower interlayer insulation films and a second contact hole penetrating the upper interlayer insulation film and the wiring;

forming a laminated film having a Ti layer as a lower layer and a TiN layer as an upper layer over the upper interlayer insulation film to bury the first and second contact holes; and performing an annealing treatment at a temperature of 610 to 630° C., thereby causing said laminated film to electrically come in contact with a surface of the active region and with a side face of the polysilicon film.

2. The method for manufacturing a semiconductor device according to claim 1, wherein the annealing treatment is a lamp annealing treatment to be performed in the $N_2$ gas atmosphere.

3. The method for manufacturing a semiconductor device according to claim 1, wherein after the annealing treatment is carried out, a film made of Al or Al alloy is formed, and said laminated film and said Al or Al film are then subjected to patterning to form an Al wiring.

4. The method for manufacturing a semiconductor device according to claim 2, wherein after the annealing treatment is carried out, a film made of Al or Al alloy is formed, and said laminated film and said Al or Al film are then subjected to patterning to form an Al wiring.

* * * * *